United States Patent
Wolthek et al.

(10) Patent No.: US 8,189,691 B2
(45) Date of Patent: May 29, 2012

(54) APPARATUS FOR RECEIVING DIFFERENTIAL SIGNAL USING A DIFFERENTIAL AMPLIFIER

(75) Inventors: Jelle Nico Wolthek, Nijmegen (NL); Cornelis Klass Waardenburg, Zeeland (NL); Cecilius Gerardus Kwakernaat, Malden (NL); Stefan Gerhard Erich Butselaar, Wijchen (NL)

(73) Assignee: NXP B.V., Eindhoven (NL)

( * ) Notice: Subject to any disclaimer, the term of this patent is extended or adjusted under 35 U.S.C. 154(b) by 872 days.

(21) Appl. No.: 11/632,028

(22) PCT Filed: Jun. 30, 2005

(86) PCT No.: PCT/IB2005/052182
§ 371 (c)(1),
(2), (4) Date: Apr. 25, 2011

(87) PCT Pub. No.: WO2006/006106
PCT Pub. Date: Jan. 19, 2006

(65) Prior Publication Data
US 2011/0188606 A1      Aug. 4, 2011

(30) Foreign Application Priority Data

Jul. 7, 2004   (EP) .................................. 04103221
Nov. 18, 2004  (EP) .................................. 04105873

(51) Int. Cl.
*H04L 25/00* (2006.01)
(52) U.S. Cl. ....................................... 375/257
(58) Field of Classification Search .................. 375/257, 375/316, 318; 359/604
See application file for complete search history.

(56) References Cited

U.S. PATENT DOCUMENTS

| | | | |
|---|---|---|---|
| 5,872,813 A | 2/1999 | Hui | |
| 6,236,243 B1 | 5/2001 | Takeshima | |
| 7,667,939 B2 * | 2/2010 | Kiuchi | 361/91.1 |
| 2002/0186047 A1 * | 12/2002 | Sterrantino | 326/86 |

FOREIGN PATENT DOCUMENTS

CN    1236956 A    12/1999
WO    03/058903 A1    7/2003

OTHER PUBLICATIONS

Malvino, A. "Electronic Principles," McGraw-Hill, p. 587 (1993).
Alcantara, S. et al. "MOS Transistor Pressure Sensor,", Proc. of the 1998 Second IEEE Int'l. Caracas Conf. on Devices, Circuits and Systems, pp. 381-85 (1998).

* cited by examiner

*Primary Examiner* — Khai Tran

(57) ABSTRACT

The invention relates to a receiver for a differential data bus with two resistive branches (1, 2, 3; 4, 5, 6), with a differential amplifier with two transistors (9, 10), with a resistor (13), and with a control logic (16) that controls a switch (15) with which a current from a current source (14) is switchable to either side of the resistor (13), which resistor couples the two transistors (9, 10), and with two operational amplifiers (17, 18) which are coupled to the two transistors (9,10) of the differential amplifier with opposite poles, in which receiver the control logic detects from the output signals of the two operational amplifiers (17,18) whether a "0" or a "1" is expected on the bus and which receiver sets the switch (25) accordingly so that a comparison with the received bus signal is made.

4 Claims, 2 Drawing Sheets

APPARATUS FOR RECEIVING DIFFERENTIAL SIGNAL USING A DIFFERENTIAL AMPLIFIER

BACKGROUND OF THE INVENTION

The invention relates to a receiver for receiving data from a differential data bus with two lines which can detect a positive and a negative level on the bus lines.

Such receivers usually have two resistive input branches, which are used to weaken the input signals from the data bus. According to solutions in the state of the art, two voltage sources in combination with two comparators are used for detecting the two levels. The exact detection levels are mainly defined by the voltage sources. If the voltage sources do not deliver exactly the same voltage, witch can easily occur in practice, the positive and negative detection levels are not equal, which should be avoided.

It is an object of the invention to provide a receiver for a differential data bus which ensures symmetrical detection levels of positive and negative signals.

This object is achieved by the receiver having the features according to claim 1:

Receiver for a differential data bus with two resistive branches, with a differential amplifier with two transistors, with a resistor, and with a control logic that controls a switch with which a current from a current source is switchable to either side of the resistor, which resistor couples the two transistors, and with two operational amplifiers which are coupled to the two transistors of the differential amplifier with opposite poles, in which receiver the control logic detects from the output signals of the two operational amplifiers whether a "0" or a "1" is expected on the bus and which receiver sets the switch accordingly so that a comparison with the received bus signal is made.

The receiver according to the invention uses only one voltage source instead of two in order to avoid level mismatches. This one voltage source is realized with one current source and one resistor. By switching the resistor between two branches of a differential amplifier this voltage source can be used for detecting a positive level on one line and a negative level on the other line, or vice versa. This ensures an absolutely symmetrical detection of levels of the two polarities, which has the consequence of a very low jitter.

The control logic puts the switch with which the current is switched on either side of the differential amplifier in accordance with the falling edge last received.

According to the advantageous measures of claim 2, two transistors can be used as the differential amplifier, thus providing a simple circuitry.

BRIEF DESCRIPTION OF THE DRAWINGS

The invention will be further described with reference to the drawings, in which.

DETAILED DESCRIPTION

Figure 1:
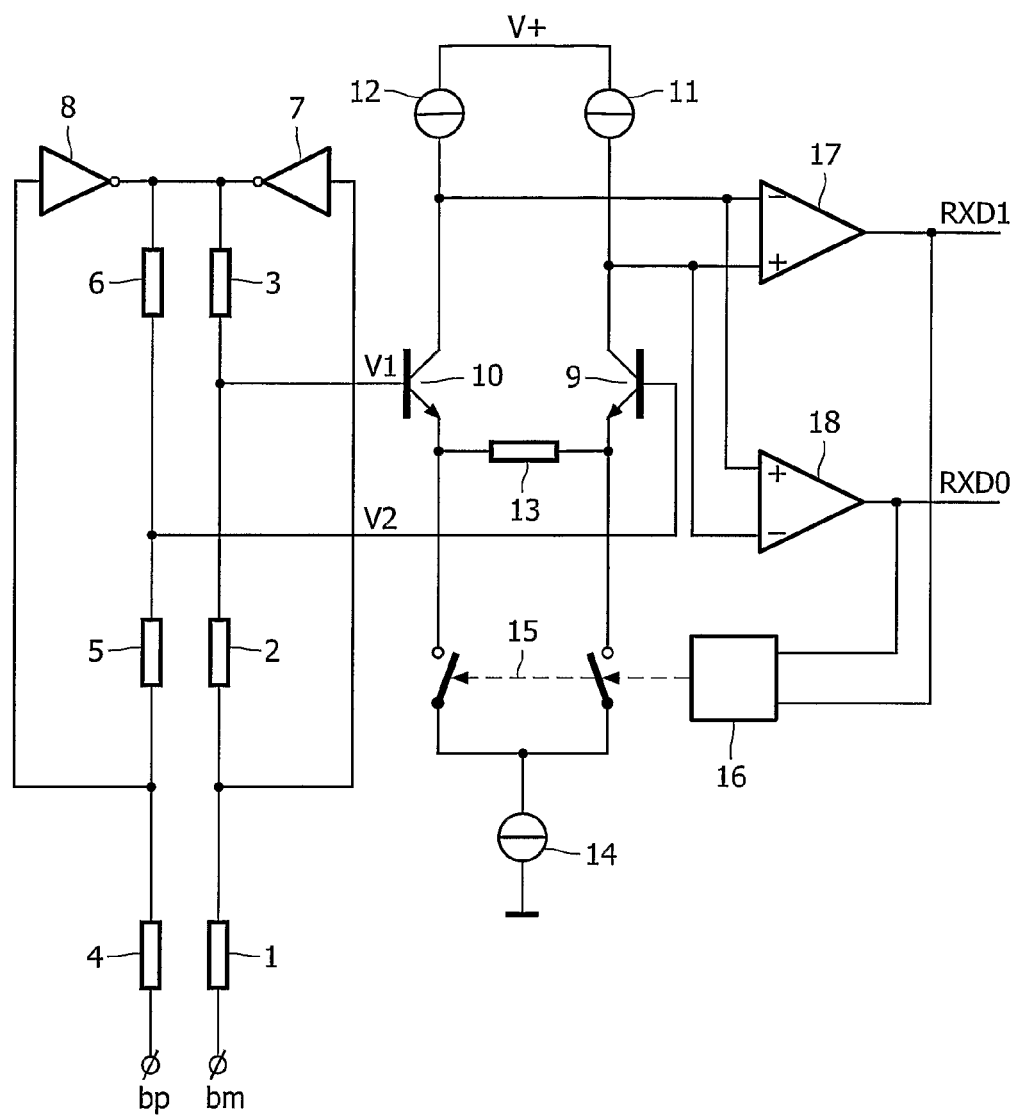
FIG. 1 is a schematic block diagram of an embodiment of a receiver according to the invention with only one voltage source used for the detection of positive as well as negative levels.

The schematic block diagram of FIG. 1 shows a receiver for a differential data bus with two lines bm and bp. As this bus works with differential signals, the signals always have opposite polarities, if the bus is not disturbed. The bus may be, for example, one according to the FlexRay standard.

FIG. 1 shows that the input stage of the receiver is provided with two branches with resistive dividers, which are used to accommodate high common input voltages.

The first divider comprises three resistors 4, 5 and 6 in series. Resistor 4 is coupled to the line bp of the bus. The second divider comprises three resistors 1, 2 and 3, also in series, of which resistor 1 is coupled to the other line bm of the data bus.

The connection between resistor 1 and resistor 2 is coupled to the input of an inverter 7, whose output is coupled to a connection between resistors 3 and 6. In the same way a second inverter 8 is coupled to the connection between resistors 4 and 5 and the connection between the last transistors 3 and 6 of the dividers.

The connection between the resistors 5 and 6 is coupled to the base of a first bipolar npn-transistor 9, while the connection between the transistors 2 and 3 is coupled to the base of a second bipolar npn-transistor 10.

The collectors of the transistors 9 and 10 are coupled via current sources 11 and 12 to a power source V+ with positive voltage.

The emitters of the two transistors 9 and 10 are coupled via a resistor 13 which, together with a current source 14, forms a voltage source which is used for detecting positive and negative levels, as will be explained below. The two transistors 9 and 10 and the resistor 13 form a differential amplifier.

The current source 14 can be switched to either side of the resistor 13 by a switch 15, which is controlled by a control logic 16.

The data outputs are realized by a second comparator 17 and a first comparator 18, which deliver the output signals RXD1 and RXD0.

The negative input of the second comparator 17 and the positive input of the first comparator 18 are coupled to the collector of the second transistor 10, while the positive input of comparator 17 and the negative input of comparator 18 are coupled to the collector of the first transistor 9.

As already mentioned, instead of using two separate voltage sources, one voltage source is formed with one resistor 13 and one current source 14. The switch 15 serves to determine whether a positive or a negative differential voltage has to be detected.

The control logic 16 detects only the falling edges of the output signals RXD0 and RXD1. A falling edge of RXD0 causes the control logic 16 to set the switch 15 to a second position, in which the current source 14 is coupled to the emitter of transistor 10, whereas a falling edge of RXD1 causes the control logic 16 to set the switch 15 to a first position, in which the current source 14 is coupled to the emitter of transistor 9.

With reference to the timing diagram in FIG. 2, it will now be explained how the receiver according to FIG. 1 works when data bits appear on the bus. The timing diagram shows the voltages of several signals in the receiver.

Figure 2:
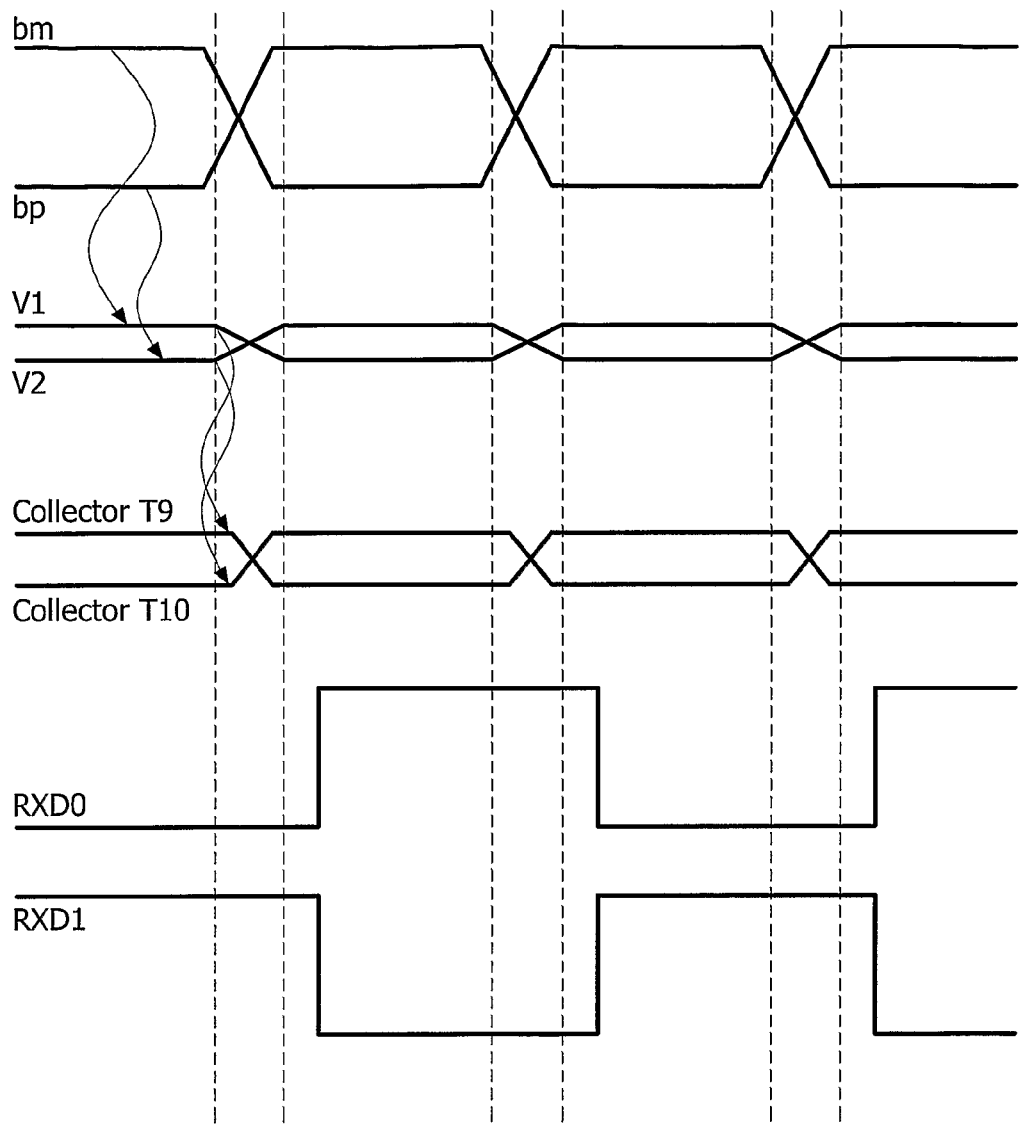
FIG. 2 is a timing diagram of the receiver according to FIG. 1 with several bits received from the data bus.

The first two signals in FIG. 2 are the bus signals bm and bp on the bus lines. As this is a differential bus, for example a bus according to the FlexRay-standard, the signals bm and bp have opposite polarities.

The next two signals in the diagram are the signals V1 and V2. These are bus signals bm and bp which have been weakened by input dividers formed by the resistors 1 to 6. The signals V1 and V2 are applied to the bases of the transistors 9 and 10, respectively.

The next two signals show the voltages at the collectors of the transistors 9 and 10.

The last two signals are the output signals RXD1 and RXD0 of the comparators 17 and 18 and of the receiver.

In the timing diagram of FIG. 2, RXD0 first is negative, so that a falling edge (not shown) must have appeared in this signal last. That is why the control logic had set the switch 15 in the second position. Now a falling edge appears in bm and a rising edge in signal bp. Consequently, the same edges appear in the weakened versions V1 and V2 of these signals. As V2 is coupled to the base of the transistor 9, this transistor switches and the potential at its collector falls, as can be seen in the timing diagram. At the same time V1 shows a falling edge, so that transistor 10 closes and the potential at its collector shows a rising edge. This has the consequence that the level of the output signal RXD1 changes from high to low, whereas the output signal RXD0 goes from low to high.

The fact that the signal RXD1 shows a falling edge causes the control logic to set the switch 15 to the first position, in which the current source 14 is coupled to the emitter of the second transistor 9, as now a falling edge in the signal bm is expected.

The timing diagram shows that in fact at the next transition the signal bp changes from high to low and that signal bm from low to high. This time, the transistors 9 and 10 are switched to the opposite positions, so that the potential at the collector of transistor 9 goes up and that at the collector of transistor 10 goes down. Consequently, the signal RXD1 shows a rising edge and RXD0 shows a falling edge this time, so that the control logic 16 switches the switch 15 to its second position, in which the current source is coupled to the emitter of transistor 10.

Now a falling edge in the signal bp is expected next and the process is repeated as described above.

The switching process of the two transistors will be explained in detail below:

The outputs of the bipolar transistors 9 and 10 switch at the point where the currents through the emitters are equal. So, at this moment the emitter currents are I/2, wherein I is the tail current of the differential pair formed by the current source 14. At this moment the current through the resistor 13 is I/2. It can thus be calculated that: $V1-Vbe-\frac{1}{2}I*R=V2-Vbe$. Now the collector of transistor 10 goes down and the collector of the transistor 9 goes up. Output RXD0 goes from 1 to 0 and output RXD1 goes from 0 to 1. The falling edge of RXD0 causes the control logic to switch the switch 15 to the other side of the resistor (The control logic only reacts to negative edges of RXD0 and RXD1, positive edges are of no influence). After this, the differential pair switches its outputs again when the point is reached where: $V2-Vbe-\frac{1}{2}*I*R=V1-Vbe$. RXD1 goes from 1 to 0, RXD0 goes from 0 to 1, and the control logic switches the tail current back to the other side of the resistor.

In the example of FIG. 2, the bus lines were already high or low at the beginning. However, this may not be the case when starting up a data bus. This means no differential voltage on the bus for a specified time. When the idle state is detected, the switch 15 is set to the first (default) position. In this position the receiver is ready to detect a "0", as, for example according to the FlexRay-standard, a "0" is always the first bit after idle. A "0" means that RXD0 will have a falling edge and on this edge the switch position will be set to the second position so that the receiver is ready to detect a "1". Now the receiver and the switching position are in the normal routine as described above.

If for some reason the first bit after idle is not a "0" but a "1", it would seem that the first bit will be missed by the system. This, however, is not the case for the following reason: the falling edges of RXD0 and RXD1 are translated into an RXD signal. So a negative edge on RXD0 makes RXD "0" and a negative edge on RXD1 makes RXD "1". Most protocols require that RXD is high when the bus is idle, so if the first bit is "1" no negative edge will arise on RXD1, RXD will stay high, and the comparator will still wait for a "0" (which should come after the previous "1"). So, the system will still work in this case.

What is claimed is:

1. Receiver for a differential data bus, the data bus having two bus lines, with two resistive branches with a differential amplifier with two transistors, each said transistor having an emitter and a collector, with a resistor and with a control logic that controls a switch with which a current from a current source is switchable to either side of the resistor which resistor couples the two transistors and with two operational amplifiers, each said operation amplifier having an output signal, which are coupled to the two transistors of the differential amplifier with opposite poles, in which receiver the control logic detects from the output signals of the two operational amplifiers whether a value "0" or a value "1" is expected on the bus and which receiver sets the switch accordingly so that a comparison with the received bus signal is made.

2. Receiver as claimed in claim 1, characterized in that the two bus lines are coupled to the emitters of the two transistors that the collector of a first transistor of the two transistors is coupled to a negative input of a first comparator and to a positive input of a second comparator, that the collector of a second transistor of the two transistors is coupled to a positive input of the first comparator and to a negative input of the second comparator, and that upon reception of a falling edge on the line of the bus that is coupled to the first transistor the potential of the collector of the second transistor goes down and that of the collector of the first transistor goes up, so that the output signal of the first comparator goes down and that of the second comparator goes up, which causes the control logic to switch the switch to a second position, in which the current source is coupled to the connection between the emitter of the second transistor and the resistor and upon reception of a falling edge on the line of the bus that is coupled to the second transistor the potential of the collector of the second transistor goes up and that of the collector of the first transistor goes down, so that the output signal of the first comparator goes up and that of the second comparator goes down, which causes the control logic to switch the switch to the first position, in which the current is coupled to the connection between the emitter of the first transistor and the resistor.

3. Receiver as claimed in claim 2, characterized in that the switch is set to the first position when the bus lines are idle.

4. Receiver as claimed in claim 1, characterized in that the data bus is a bus according to the FlexRay standard.

* * * * *